(12) United States Patent
George et al.

(10) Patent No.: US 11,002,792 B2
(45) Date of Patent: May 11, 2021

(54) MACHINE SLIP AND DIRECTION SENSING USING FLUX GATE SENSOR

(71) Applicant: ITT MANUFACTURING ENTERPRISES LLC., Wilmington, DE (US)

(72) Inventors: Naveen George, Rochester, NY (US); Cody Arliss, Clyde, NY (US); Simon Bradshaw, Seneca Falls, NY (US); Jeffrey Sullivan, Syracuse, NY (US)

(73) Assignee: ITT MANUFACTURING ENTERPRISES LLC, Wilmington, DE (US)

( * ) Notice: Subject to any disclaimer, the term of this patent is extended or adjusted under 35 U.S.C. 154(b) by 179 days.

(21) Appl. No.: 16/229,404

(22) Filed: Dec. 21, 2018

(65) Prior Publication Data

US 2020/0200822 A1 Jun. 25, 2020

(51) Int. Cl.
- *G01R 31/34* (2020.01)
- *F16C 35/07* (2006.01)
- *G01R 33/04* (2006.01)

(52) U.S. Cl.
CPC .......... *G01R 31/343* (2013.01); *F16C 35/07* (2013.01); *G01R 33/045* (2013.01)

(58) Field of Classification Search
CPC ....... G01R 31/343; H02P 6/16; H02P 29/024; H02P 23/14
USPC .................................................. 318/727, 34
See application file for complete search history.

(56) References Cited

U.S. PATENT DOCUMENTS

| | | | | |
|---|---|---|---|---|
| 5,828,210 A | * | 10/1998 | Kliman | G01P 3/48 324/173 |
| 6,014,007 A | * | 1/2000 | Seibel | H02P 21/34 318/798 |
| 6,138,078 A | | 10/2000 | Canada et al. | |
| 7,930,076 B2 | * | 4/2011 | Daum | B60T 13/665 701/19 |
| 8,319,461 B2 | * | 11/2012 | Wystup | H02P 25/024 318/400.2 |
| 2019/0267923 A1 | | 8/2019 | Anders et al. | |

FOREIGN PATENT DOCUMENTS

| | | |
|---|---|---|
| GB | 2113844 A | 8/1983 |
| WO | 2018086830 A1 | 5/2018 |

OTHER PUBLICATIONS

International Search Report and Written Opinion for PCT/US2019/067804, dated Apr. 2, 2020, 15 pages.

* cited by examiner

*Primary Examiner* — David Luo
(74) *Attorney, Agent, or Firm* — Carter, DeLuca & Farrell LLP; George Likourezos; Bret P. Shapiro (57) ABSTRACT

Apparatus features a signal processor configured to receive signaling from a flux sensor containing information about a residual field from an electrical supply to a motor of a driven machine and a magnetic field from one or more rotating magnets placed on a rotating component of the driven machine; and determine corresponding signaling containing information about the operation of the driven machine, based upon a difference between an electrical supply frequency and a slip frequency determined from the signaling received and processed. The signal processor also provides the corresponding signaling for further processing to determine further information about the operation of the machine.

20 Claims, 4 Drawing Sheets

---

Apparatus 10, e.g., including a pump system having an electric motor 12, a coupling 14, a drive end bearing assembly 16 and a pump or driven machine 18, featuring Signal processor 100 configured at least to:

receive signaling from a flux sensor 22 containing information about a residual field from an electrical supply to the motor 12 of the pump or driven machine 18 and a magnetic field from one or more rotating magnets 24a, 24b, 24c, 24d placed on a rotating component 24 of the pump or driven machine 18;

determine corresponding signaling containing information about the operation of the pump or driven machine 18, based upon a difference between an electrical supply frequency and a slip frequency determined from the signaling received and processed; and/or provide the corresponding signaling containing information about determined for further processing to determine further information about the operation of the pump or driven machine 18.

Other signal processor circuits, circuitry, or components 102 that do not form part of the underlying invention, e.g., including input/output modules/modems, one or more memory modules (e.g., RAM, ROM, etc.), data, address and control busing architecture, etc.

Figure 4: The Rotating Magnetic Array

Apparatus 10, e.g., including a pump system having an electric motor 12, a coupling 14, a drive end bearing assembly 16 and a pump or driven machine 18, featuring Signal processor 100 configured at least to:

receive signaling from a flux sensor 22 containing information about a residual field from an electrical supply to the motor 12 of the pump or driven machine 18 and a magnetic field from one or more rotating magnets 24a, 24b, 24c, 24d placed on a rotating component 24 of the pump or driven machine 18;

determine corresponding signaling containing information about the operation of the pump or driven machine 18, based upon a difference between an electrical supply frequency and a slip frequency determined from the signaling received and processed; and/or provide the corresponding signaling containing information about determined for further processing to determine further information about the operation of the pump or driven machine 18.

Other signal processor circuits, circuitry, or components 102 that do not form part of the underlying invention, e.g., including input/output modules/modems, one or more memory modules (e.g., RAM, ROM, etc.), data, address and control busing architecture, etc.

Figure 5

MACHINE SLIP AND DIRECTION SENSING USING FLUX GATE SENSOR

BACKGROUND OF THE INVENTION

1. Field of the Invention

The present invention relates to a pump system, e.g., having a motor, a coupling, a drive end bearing assembly and a pump or driven machine.

2. Brief Description of Related Art

Flux gate sensors have been widely utilized in the past to sense electro-magnetic fields. One specific use is to sense the line frequency of the electrical supply to an electric motor. While this provides information on the line frequency, it does not provide information on the actual speed of an induction (asynchronous) motor as the slip speed cannot be measured.

Prior art solutions to recover the slip speed information include utilizing a variable frequency drive (VFD) to drive the motor. Depending on the technology (typically sensor-less vector control), in the VFD it is possible to compute the slip speed, however this is a computed and not an exact value. Additionally for motors without a VFD drive, this solution cannot be deployed. Additionally if the driven machine is connected to the motor using V belts, the VFD computed slip cannot detect slippage due to the drive belts loosening.

Another prior art solution is to utilize an optical sensor or inductive sensor to sense the speed of the motor and driven machine. Both these technologies have drawbacks (in addition to requiring an additional sensor):

Optical sensors require some kind of target mark on the shaft or coupling which has an optical reflectivity difference from the shaft/coupling material itself. Over time dust and other contaminants can obscure the mark preventing the signal being read effectively. The sensor must also maintain direct line of sight to the target mark which precludes its use in some applications.

Inductive sensors require a notch or other feature to be incorporated in the shaft or coupling that will trigger the sensor. They must be mounted very close to the notch in order to ensure that a clean signal is obtained. This precludes their use in some applications.

Prior solutions for sensing direction of shaft rotation have utilized optical or inductive sensors. In the standard implementation two sensors are required to determine shaft rotation. This is done by comparing which of the two sensors is triggered first (in the time domain), by the passing optical target or inductive notch. An alternative implementation utilizes a single optical sensor in conjunction with a complex optical target which utilizes variable shading or optical pattern. A third implementation utilizes a single inductive sensor in conjunction with a notch of complex shape that creates response waveform shape that can be processed to determine the direction of shaft rotation. All of these implementations incur the same disadvantages noted above in addition to sometimes requiring additional sensors.

SUMMARY OF THE INVENTION

In summary, and according to some embodiment of the present invention disclosed herein, the present invention may be configured to utilize any component of the driven machine that rotates with the shaft and is in proximity to the machine bearing housing or other location where the flux sensor will be mounted. Preferred embodiments may be configured to utilize a bearing isolator for implementing this task, the shaft of the driven machine itself may also be utilized directly instead of a rotating component.

By way of example, a single or array of magnets may be placed in the bearing isolator or other rotating component or the shaft of the machine. The magnet(s) may be sized such that as the component rotates the magnetic field acts on the flux sensor which is mounted in the general vicinity—typically on the bearing housing.

In operation, the flux sensor will sense both the residual field from the electrical supply to the motor as well as the magnetic field from the rotating magnet. Because the driven machine rotates slower than the electrical supply frequency (due to the motor slip), the two different frequencies exist in the output signal from the flux sensor. Using frequency isolating techniques such as a Fast Fourier Transformation (FFT), both the motor supply frequency and the slip frequency can be identified with a high degree of accuracy.

The difference between the electrical supply frequency and slip frequency being determined and known, enables a number of benefits:

1) The amount of slip can be compared to the motor characteristics to determine its percentage of load and power output. The amount of slip can also determine the torque and thereby the current drawn due to the slip.
2) In the case of a malfunction of the driven machine, an amount of slip outside of the normal range (e.g., either too little as in the case of a dry running pump, or too much as in the case of an overloaded or seizing pump), can be detected and an alarm or other notification made.
3) In a belt drive application, increased belt slippage over time can be detected and an alarm or other notification made.
4) The slip frequency measured can be used to provide exact synchronization of any vibration time waveform detected on the driven machine (using a separate vibration transducer). This synchronization allows the use of more vibration analysis techniques than would be possible had only the vibration time waveform been available.

Moreover, sensing of the direction of rotation of the shaft may be achieved by utilizing the array of magnets noted above in a controlled pattern. The controlled pattern may be achieved by one or more of the following: magnet location, magnet number, magnet strength or magnet polarity. The movement of the magnet array past the flux sensor creates a unique series of pulses that can be processed to determine whether the shaft rotation is clockwise or counterclockwise.

The present invention and underlying concept can be utilized on any driven machine.

By way of example, proof of concept (PoC) testing was made utilizing a bearing housing test rig driven by an electric motor. The magnet array was mounted in the bearing isolator. With the flux sensor mounted on the top of the bearing housing, both the supply and slip frequency were detected and processed, consistent with that set forth above.

Specific Embodiments

By way of example, and according to some embodiments, the present invention may include, or take the form of, apparatus featuring a signal processor configured to
receive signaling from a flux sensor containing information about a residual field from an electrical supply to a motor of a driven machine and a magnetic field from one or more rotating magnets placed on a rotating component of the driven machine; and determine corresponding signaling containing information about the operation of the driven machine, based upon a difference between an electrical supply frequency and a slip frequency determined from the signaling received and processed.

According to some embodiments, the present invention may include one or more of the features, as follows:

The signal processor may be configured to provide the corresponding signaling for further processing to determine further information about the operation of the driven machine.

The signal processor may be configured to determine a percentage of load and power output of the driven machine based upon a comparison of an amount of slip to motor characteristics of the driven machine.

The signal processor may be configured to determine the torque and the current drawn of the driven machine due to the amount of slip.

The signal processor may be configured to detect a malfunction of the driven machine, based upon an amount of slip outside of a normal range, including either too little as in the case of a dry running pump, or too much as in the case of an overloaded or seizing pump, and may provide in the corresponding signaling containing information about an alarm or other notification.

The signal processor may be configured to detect increased belt slippage over time in a belt drive application, and may provide in the corresponding signaling containing information about an alarm or other notification.

The signal processor may be configured to receive associated signaling from a vibration transducer placed on, or in relation to, the driven machine, and may provide a synchronization of a vibration time waveform detected on the driven machine, based upon the slip frequency determined.

The apparatus may include the vibration transducer.

The apparatus may include the flux sensor and a driven machine bearing housing, the flux sensor being arranged on, or in relation to, the driven machine bearing housing.

The apparatus may include the rotating component having the one or more magnets placed thereon or therein.

The rotating component may include a bearing isolator having a stationary part and a rotating part with the one or more magnets placed therein.

The rotating component may include a shaft of the driven machine having the one or more magnets placed thereon.

The flux sensor may be mounted to a driven machine bearing housing at a location; and the rotating component may be configured to rotate with a shaft of the driven machine, or is in proximity to the driven machine bearing housing or the location where the flux sensor is mounted.

The signaling may be received as an output signal from an output of the flux sensor.

The signal processor may be configured to process the signaling received and determine the electrical supply frequency and the slip frequency based upon a frequency isolating technique.

The frequency isolating technique may include using a Fast Fourier Transformation (FFT) technique.

The one or more magnets may be placed on the rotating component in a controlled pattern; and the signal processor may be configured to determine the direction of rotation of the shaft of the driven machine, based upon the signaling received. By way of example, the controlled pattern may include, or take the form of, one or more of the following: magnet location, magnet number, magnet strength or magnet polarity.

The signal processor may be configured to determine the direction of rotation of the shaft of the driven machine, e.g., based upon the signaling received that contains information about the movement of the one or more magnets that rotate past the flux sensor and create a unique series of pulses that are processed to determine whether the shaft's rotation is clockwise or counterclockwise.

The rotating component may include, or take the form of, a bearing isolator having a stationary part and a rotating part with the one or more magnets placed therein or thereon.

The driven machine may include, or take the form of, the motor for driving a pump.

The apparatus may include, or take the form of, the driven machine having the motor for driving a pump.

The Controller

By way of further example, the present invention may include, or take the form of, a controller featuring a signal processor configured to:

receive signaling from a flux sensor containing information about a residual field from an electrical supply to a motor of a pump and about a magnetic field from one or more rotating magnets placed on a rotating component of the pump; and determine corresponding signaling containing information about the operation of the pump, based upon a difference between an electrical supply frequency and a slip frequency determined from the signaling received and processed.

The controller may also include one or more of the features set forth herein. For example, the controller may be, or form part of, a variable frequency drive for controlling the operation of the motor and the pump.

The Method

According to some embodiments, the present invention may include, or take the form of, a method having steps, e.g., for receiving, with a signal processor, signaling from a flux sensor containing information about a residual field from an electrical supply to a motor of a driven machine and a magnetic field from one or more rotating magnets placed on a rotating component of the driven machine; and determining, with the signal processor, corresponding signaling containing information about the operation of the driven machine, based upon a difference between an electrical supply frequency and a slip frequency determined from the signaling received and processed.

The method may include one or more of the features set forth herein, e.g., including providing, with the signal processor, the corresponding signaling for further processing to determine further information about the operation of the driven machine; or arranging the flux sensor in relation to the electrical supply to the motor of the driven machine and the one or more rotating magnets placed on the rotating component of the driven machine in order to sense the residual field and the magnetic field; or arranging the flux sensor on, or in relation to, a driven machine bearing housing of the driven machine.

Advantages

One advantage of the present invention is that it provides a better way to monitor the operation of a driven machine, e.g., like a pump in a pump system.

BRIEF DESCRIPTION OF THE DRAWING

The drawing includes FIGS. 1-5, which are not necessarily drawn to scale, as follows:

FIG. 4 includes FIGS. 4A thru 4C, where

DETAILED DESCRIPTION OF THE INVENTION

Figure 1:
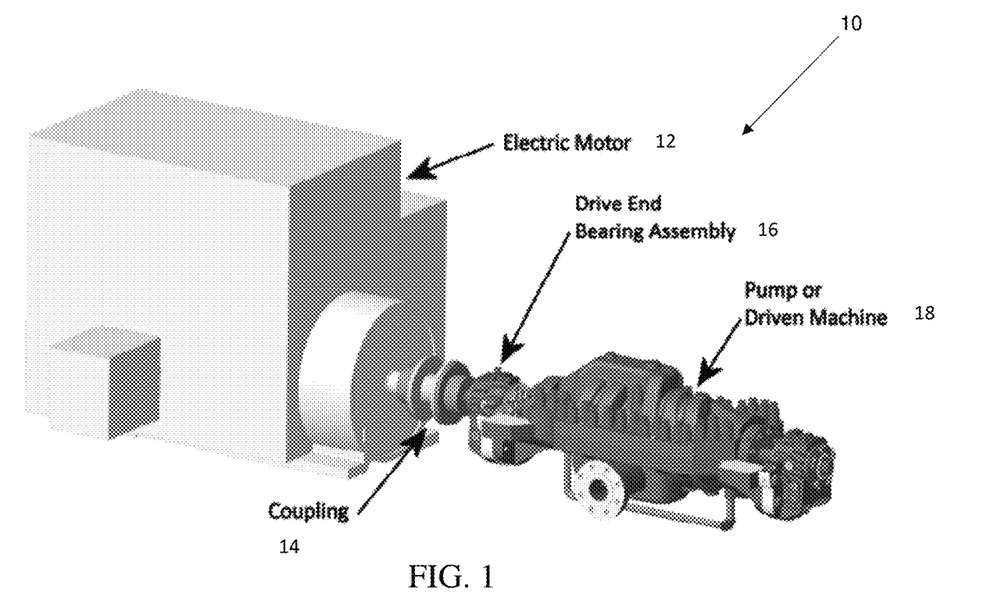
FIG. 1 is a perspective view of apparatus, e.g., including a pump system having an electric motor, a coupling, a drive end bearing assembly and a pump or driven machine, according to some embodiments of the present invention.
Figure 2:
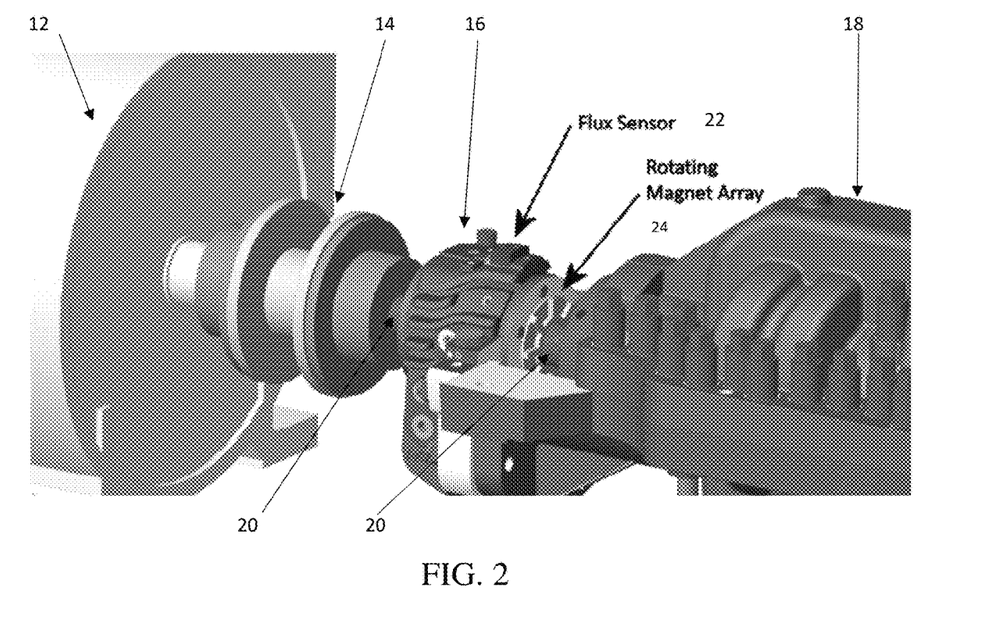
FIG. 2 is a perspective view of the apparatus in FIG. 1, showing in further detail the drive end bearing assembly having a flux sensor arranged in relation to a rotating magnet array, according to some embodiments of the present invention.
Figure 3:
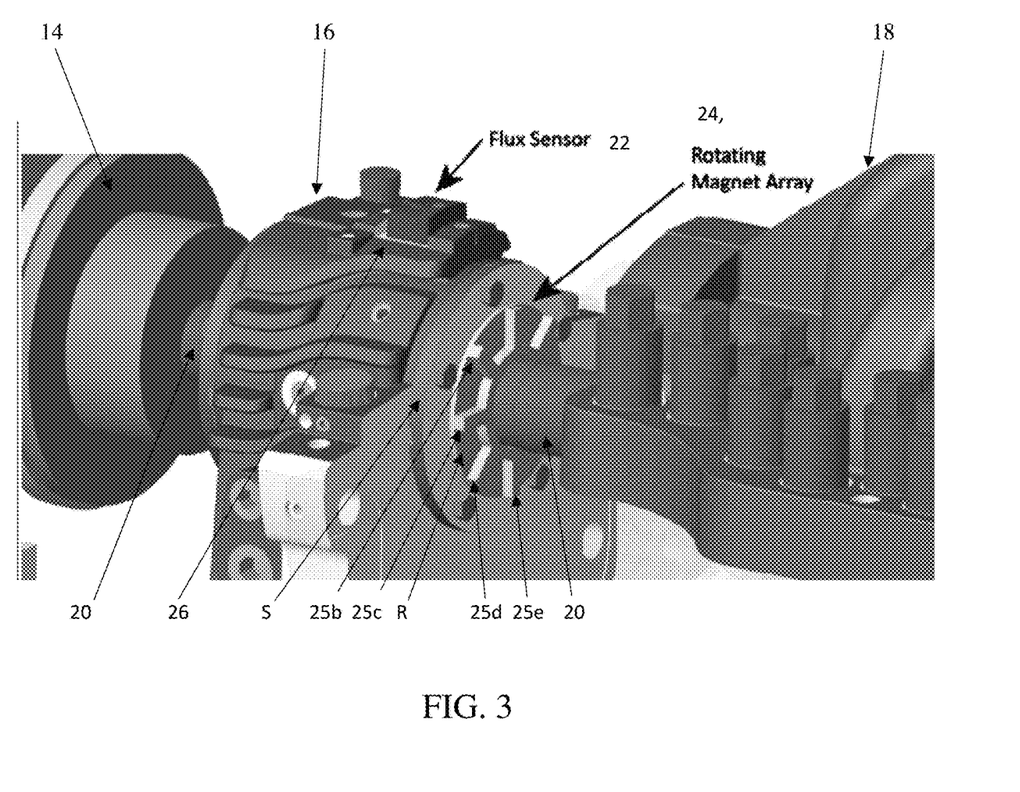
FIG. 3 is a perspective view of the apparatus in FIG. 2, showing in further detail the drive end bearing assembly having a flux sensor arranged in relation to a rotating magnet array, according to some embodiments of the present invention.

FIGS. 1-3: Apparatus 10, e.g. Such as a Pump System

Figure 4A:
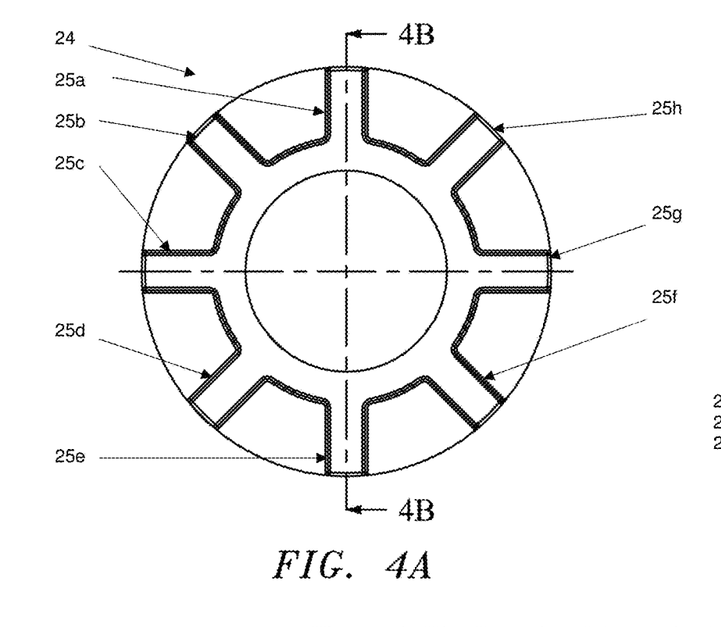
FIG. 4A shows a view of the rotating magnetic array in FIGS. 1-3.

By way of example, and according to some embodiments, the present invention may include, or take the form of, apparatus generally indicated as 10, e.g., such as a pump system having an electric motor 12, a coupling 14, a drive end bearing assembly 16, a pump or driven machine 18, a shaft 20, a flux sensor 22, a rotating component 24 (e.g., like a rotating magnet array 24 (see also FIG. 4)), and a signal processor 100 (see FIG. 5), according to some embodiments of the present invention.

By way of example, the shaft 20 extends from the pump or driven machine 18, and couples to, and rotates in, the drive end bearing assembly 16. On one side of the drive end bearing assembly 16, the coupling 14 connects the electric motor 12 to the shaft 20. On the other side of the drive end bearing assembly 16, the shaft 20 couples or connects to the rotating magnet array 24, and causes the rotating magnet array 24 to rotates as the shaft 20 rotates by the electric motor 12 in relation to the flux sensor 22. By way of example, the drive end bearing assembly 16 includes a driven machine bearing housing 26, and the flux sensor 22 is arranged on the driven machine bearing housing 26. The rotating magnet array 24 may include one or more magnets 24a, 24e, 24h, e.g., that may be configured in one or more radially extending members like 25a, 25b, 25c, 25d, 25e, 25f, 25g, 25h (see FIG. 4A). The one or more magnets 24a, 24e, 24h may be placed on (e.g., arranged on or inside) the one or more radially extending members of the rotating magnet array 24, e.g., consistent with that set forth below in relation to FIG. 4.

In operation, the signal processor 100 (FIG. 5) may be configured to receive signaling from the flux sensor 22 containing information about a residual field from an electrical supply to the motor 12 of the pump or driven machine 18 and a magnetic field from the one or more rotating magnets 24a, 24e, 24h placed on the rotating magnet array 24 of the pump or driven machine 18. The signal processor 100 may also be configured to determine corresponding signaling containing information about the operation of the pump or driven machine 18, e.g., based upon a difference between an electrical supply frequency and a slip frequency determined from the signaling received and processed.

Figure 5:
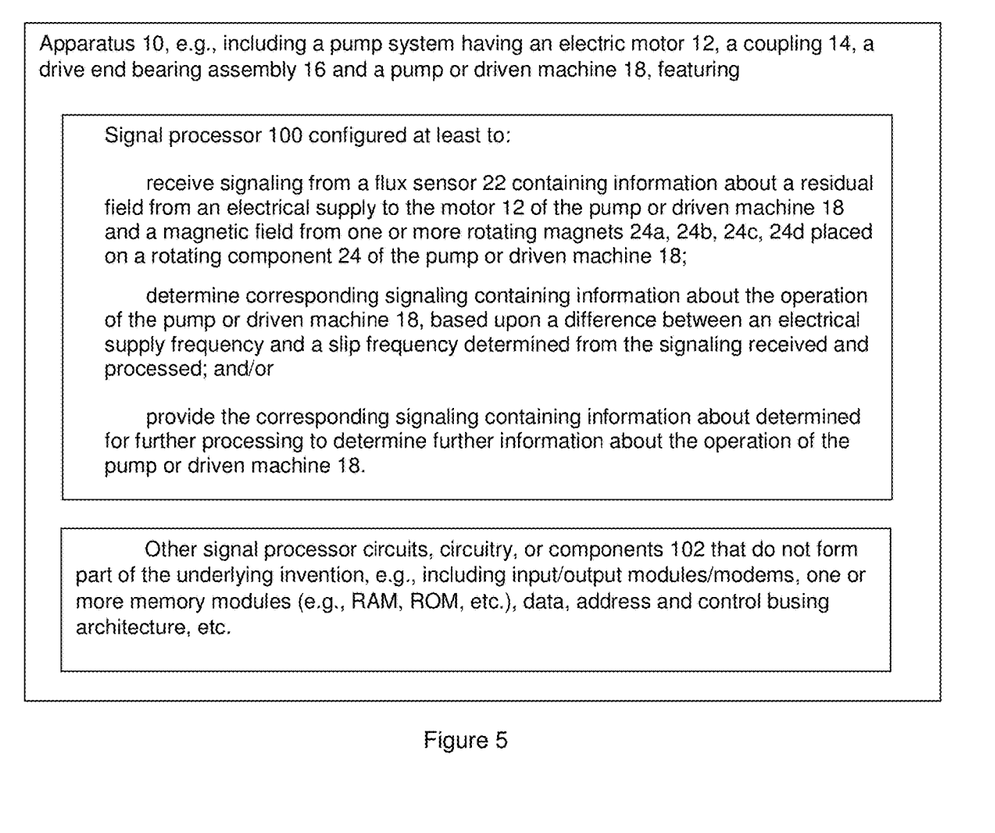
FIG. 5 is a block diagram of apparatus, e.g., including a pump system having an electric motor, a coupling, a drive end bearing assembly and a pump or driven machine, having a signal processor for implementing the signal processing functionality, according to some embodiments of the present invention.

By way of further example, the signal processor 100 may be configured to provide the corresponding signaling for further processing to determine further information about the operation of the pump or driven machine 18. For example, the signal processor 100 may also be configured to determine a percentage of load and power output of the pump or driven machine 18 based upon a comparison of an amount of slip to motor characteristics of the pump or driven machine 18. The signal processor 100 may be configured to determine the torque and thereby the current drawn of the pump or driven machine 18 due to the amount of slip. The signal processor 100 may be configured to detect a malfunction of the pump or driven machine 18, e.g., based upon an amount of slip outside of a normal range, including either too little as in the case of a dry running pump, or too much as in the case of an overloaded or seizing pump, and may provide in the corresponding signaling an alarm or other notification. The signal processor 100 may be configured to detect increased belt slippage over time in a belt drive application, and may provide in the corresponding signaling containing information about an alarm or other notification.

By way of example, the signaling may be received as an output signal from an output of the flux sensor 22. The signal processor 100 may be configured to process the signaling received and determine the electrical supply frequency and the slip frequency based upon a frequency isolating technique. The frequency isolating technique may include using a Fast Fourier Transformation (FFT) technique, as well as other types or kind of transformation techniques that are now known or later developed in the future.

By way of example, the rotating component like element 24 may include, or take the form of, a bearing isolator having a stationary part and a rotating part like element R with the one or more magnets 24a, 24e, 24h placed or arranged therein or thereon. The stationary part may include, or take the form of, some part like element S (FIG. 3) connected to the driven machine bearing housing 26.

By way of example, and consistent with that shown in FIGS. 1-3, the flux sensor 22 may be mounted to the driven machine bearing housing 26 at a location like that shown; and the rotating component like the rotating magnet array 24 may be configured to rotate with the shaft 20 of the pump or driven machine 18, or may be in reasonably close proximity to the driven machine bearing housing 26. In other words, the flux sensor 22 does not have to be mounted directly on, or connected directly to, the driven machine bearing housing 26. The scope of the invention is intended to include, and embodiments are envisioned in which, the flux sensor 22 is mounted on or to some other component on or near the pump system for sensing the rotating magnet array 24.

The Rotational Direction

The signal processor 100 may be configured to determine the direction of rotation of the shaft 20 of the pump or driven machine 18, e.g., based upon the signaling received that contains information about the movement of the one or more magnets 24a, 24e, 24h, that rotate past the flux sensor 22 and create a unique series of pulses that are processed to determine whether the shaft's rotation is clockwise or counterclockwise. The number and placement of the magnets will affect the detection of the direction of rotation.

FIG. 4: The Rotating Magnetic Array

Figure 4B:
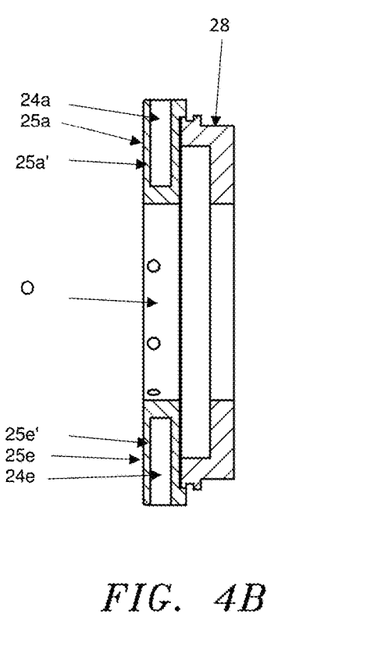
FIG. 4B shows a cross-sectional view of the rotating magnetic array in FIG. 4A along lines 4B-4B.
Figure 4C:
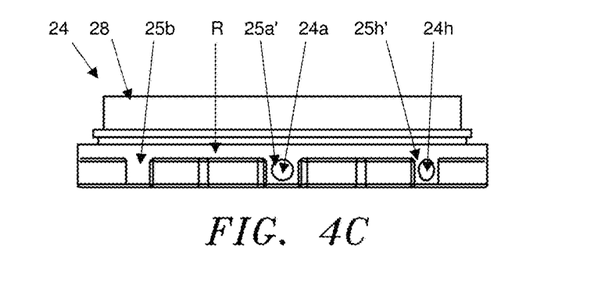
FIG. 4C shows a top view of the rotating magnetic array in FIG. 4A, all according to some embodiments of the present invention.

FIG. 4 shows the rotating magnet array 24, which may include the one or more radially extending members 25a, 25b, 25c, 25d, 25e, 25f, 25g, 25h, where each may have, or may be configured to receive or contain, a respective magnet like element(s) 24a, 24e, 24h. In FIGS. 4B and 4C, the radially extending members 25a, 25e, 25h may be configured with orifices, openings, or apertures 25a', 25e', 25h' to receive the one or more of magnets 24a, 24e, 24h.

The one or more magnets may be placed on or in the rotating magnet array 24 in a controlled pattern, e.g., like that shown in FIGS. 1-4, which includes eight equally spaced radially extending members 25a, 25b, 25c, 25d, 25e, 25f, 25g, 25h. The signal processor 100 may be configured to determine the direction of rotation of the shaft 20 of the pump or driven machine 18, based upon the signaling received. The controlled pattern may include, or take the form of, one or more of the following: magnet location, magnet number, magnet strength or magnet polarity.

The rotating magnet array 24 may be configured with a central orifice, aperture or opening generally indicated as O, e.g., configured to receive the shaft 20. The rotating magnet array 24 may be affixedly coupled to the shaft 20, e.g., using techniques known in the art.

The rotating magnet array 24 may also include a member 28 configured or coupled thereon, as well as sealing members (not shown) to couple rotationally to the stationary part S, so that the rotating magnet array 24 may rotate in relation to the stationary part S and function as a bearing isolator, as one skilled in the art would appreciate.

FIG. 5: Signal Processor Implementation

The apparatus 10 may include the signal processor or signal processing circuit/module 100, e.g., that may be configured to perform basic signal processing functionality for implementing the present invention, e.g., consistent with that disclosed herein. By way of example, the signal processor 100 may be configured as a stand alone signal processor or signal processing module, form part of a control or controller circuit/module, etc., or form part of some other circuit/circuitry/module. Many different types and kinds of signal processors, controllers and controller modules are known in the art, for example, including programmable logic controllers, etc. By way of example, based on an understanding of such known signal processors, one skilled in the art would be able to configure the signal processor 100 to perform the aforementioned signal processing functionality consistent with that described herein. The controller may include, or take the form of, a VFD.

By way of still further example, the functionality of the signal processor 100 may be implemented using hardware, software, firmware, or a combination thereof, although the scope of the invention is not intended to be limited to any particular embodiment thereof. In a typical software implementation, such a signal processor or signal processing module may include one or more microprocessor-based architectures having a microprocessor, a random access memory (RAM), a read only memory (ROM), input/output devices and control, data and address buses connecting the same like that in element 102, e.g., for running a program code based upon an algorithm consistent with that disclosed herein. One skilled in the art would be able to program such a microprocessor-based implementation to perform the signal processing functionality described herein without undue experimentation, including where the signal processor and a memory combine to implement a program code, e.g., stored in the memory, so as to cause the signal processor to implement the aforementioned signal processing functionality. The scope of the invention is not intended to be limited to any particular implementation using technology both now known or later developed in the future.

The signal processor 100 may include the one or more other circuits/modules like element 102 to perform other functionality that is known in the art, that does not form part of the underlying invention, and that is not described in detail herein. By way of example, the other circuits/modules 102 may include input/output circuit/modules, memory circuit/modules (e.g., RAM, ROM, EPROM, etc.), busing circuit/modules or architecture for exchanging signaling between the various circuit/modules, etc.

In operation, the signal processor 100 may be configured to receive signaling containing information about a residual field from an electrical supply to a motor of a driven machine and a magnetic field from one or more rotating magnets placed on a rotating component of the driven machine; and determine corresponding signaling containing information about the operation of the driven machine, based upon a difference between an electrical supply frequency and a slip frequency determined from the signaling received and processed. By way of example, the signaling may be stored in a database in the memory forming part of element 102 and provided to the signal processor 100.

Moreover, the signal processor 100 may be configured to determine and provide the corresponding signaling containing information about the operation of the driven machine for further processing, including shutting down the pump or driven machine for repair, providing an audio or visual alarm warning signal, or schedule a suitable maintenance event. By way of example, the provisioning of the corresponding signaling may be implemented by an output module forming part of element 102.

The Vibration Transducer

The signal processor may be configured to receive associated signaling from a vibration transducer placed on, or in relation to, the pump or driven machine, and may provide a synchronization of a vibration time waveform detected on the pump or driven machine, based upon the slip frequency determined. The vibration transducer may include, or form part of, alarm and/or condition monitoring devices, e.g., like that disclosed in one or more of the patents or patent applications listed below assigned to the assignee of the present application, including alarms and condition monitoring devices, which are all incorporated by reference in their entirety. By way of example, the alarm or condition monitoring device may be configured on the driven machine bearing housing 26.

Alarm or Condition Monitoring Devices

The assignee of the present invention has developed and manufactures a family of alarm and/or condition monitoring devices for bearings and pumps, e.g., known as an iAlert™ device. By way of example, the family of such alarm and/or condition monitoring devices may include that disclosed in the following:

Patent application Ser. No. 14/685,134, filed 13 Apr. 2015, entitled "Sensing module for monitoring conditions of a pump or pump assembly,";

Patent application Ser. No. 29/516,282, filed 30 Jan. 2015, entitled "Mounting bracket and a combination of a mounting bracket and a sensing module,";

Patent application Ser. No. 29/516,277, filed 30 Jan. 2015, entitled "Sensing module,";

Patent application Ser. No. 14/681,577, filed 8 Apr. 2015, entitled "Nodal dynamic data acquisition and dissemination device,";

Patent application Ser. No. 12/240,287, filed 29 Sep. 2008, entitled "Compact self-contained condition monitoring device," which issued as U.S. Pat. No. 8,154,417 on 10 Apr. 2012; as well as Patent application Ser. No. 29/292,324, filed 5 Oct. 2007, entitled "Compact self-contained condition monitoring device," which issued as U.S. Pat. Des. No. 586,670 on 17 Feb. 2009.

Driven Machines

Driven machines, e.g., like pumps or rotary devices, reciprocating machines, engines, blowers, are known in the art, and are not described in detail herein. Moreover, the scope of the invention is not intended to be limited to any particular type or kind thereof that is either now known or later developed in the future.

Bearing Isolators

Bearing isolators are known in the art, and the scope of the invention is not intended to be limited to any particular type or kind thereof, e.g., including either bearing isolators now known or later developed in the future. In addition to that disclosed herein, and by way of further example, the bearing isolator may include, or take the form of, any one or more of the following technologies disclosed in one or more of the following U.S. Pat. Nos. 5,044,784; 5,044,785; 9,051,968; 9,140,366; 9,249,831, which are all incorporated by reference in their entirety.

The Present Invention Overcomes Problems in the Prior Art

In effect, the present invention addresses and resolves the issues discussed in the aforementioned background of the invention section, e.g., specifically including:

the need for providing a better VFD;

the fact that a prior art VFD only provided a computed slip value;

the inability of the prior art VFD to detect belt slippage in V belt driven applications;

the need for separate optical or inductive sensors;

the need to engineer sensor line of sight;

the possibility of loss of signal due to optical target fouling;

the need to engineer a notch in the shaft or coupling;

the need to insert the inductive sensor in close proximity to the notch; and the need to utilize two sensors or an optical pattern (subject to the fouling noted above), to sense direction of shaft rotation.

The Scope of the Invention

It should be understood that, unless stated otherwise herein, any of the features, characteristics, alternatives or modifications described regarding a particular embodiment herein may also be applied, used, or incorporated with any other embodiment described herein. Also, the drawing herein is not drawn to scale.

Although the invention has been described and illustrated with respect to exemplary embodiments thereof, the foregoing and various other additions and omissions may be made therein and thereto without departing from the spirit and scope of the present invention.

What is claimed is:

1. An apparatus comprising:
a signal processor configured to
receive signaling from a flux sensor containing information about both a residual field from an electrical supply to a motor of a driven machine and a magnetic field from one or more rotating magnets placed on a rotating component of the driven machine; and
determine corresponding signaling containing information about the operation of the driven machine, based upon a difference between an electrical supply frequency and a slip frequency determined from the signaling received and processed.

2. The apparatus according to claim 1, wherein the signal processor is configured to provide the corresponding signaling for further processing to determine further information about the operation of the driven machine.

3. The apparatus according to claim 1, wherein the signal processor is configured to determine a percentage of load and power output of the driven machine based upon a comparison of an amount of slip to motor characteristics of the driven machine.

4. The apparatus according to claim 3, wherein the signal processor is configured to determine the torque and the current drawn of the driven machine due to the amount of slip.

5. The apparatus according to claim 1, wherein the signal processor is configured to detect a malfunction of the driven machine, based upon an amount of slip outside of a normal range, including either too little as in the case of a dry running pump, or too much as in the case of an overloaded or seizing pump, and provide in the corresponding signaling containing information about an alarm or other notification.

6. The apparatus according to claim 1, wherein the signal processor is configured to detect increased belt slippage over time in a belt drive application, and provide in the corresponding signaling containing information about an alarm or other notification.

7. The apparatus according to claim 1, wherein the apparatus comprises a vibration transducer; and the signal processor is configured to receive associated signaling from the vibration transducer placed on, or in relation to, the driven machine, and provide a synchronization of a vibration time waveform detected on the driven machine, based upon the slip frequency determined.

8. The apparatus according to claim 1, wherein the apparatus comprises the flux sensor and a driven machine bearing housing, the flux sensor being arranged on, or in relation to, the driven machine bearing housing.

9. The apparatus according to claim 1, wherein the apparatus comprises the rotating component having the one or more magnets placed thereon.

10. The apparatus according to claim 1, wherein the rotating component comprises a bearing isolator having a stationary part and a rotating part with the one or more magnets placed therein.

11. The apparatus according to claim 1, wherein the rotating component comprises a shaft of the driven machine having the one or more magnets placed thereon.

12. The apparatus according to claim 1, wherein the flux sensor is mounted to a driven machine bearing housing at a location; and
 the rotating component is configured to rotate with a shaft of the driven machine, or is in proximity to the driven machine bearing housing or the location where the flux sensor is mounted.

13. The apparatus according to claim 1, wherein the signal processor is configured to process the signaling received and determine the electrical supply frequency and the slip frequency based upon a frequency isolating technique.

14. The apparatus according to claim 13, wherein the frequency isolating technique includes using a Fast Fourier Transformation (FFT) technique.

15. The apparatus according to claim 1, wherein the one or more magnets is placed on the rotating component in a controlled pattern; and
 the signal processor is configured to determine the direction of rotation of a shaft of the driven machine, based upon the signaling received.

16. The apparatus according to claim 15, wherein the controlled pattern may include, or take the form of, one or more of the following: magnet location, magnet number, magnet strength or magnet polarity.

17. The apparatus according to claim 16, wherein the signal processor is configured to determine the direction of rotation of a shaft of the driven machine, based upon the signaling received that contains information about the movement of the one or more magnets that rotate past the flux sensor and create a unique series of pulses that are processed to determine whether the shaft's rotation is clockwise or counterclockwise.

18. The apparatus according to claim 1, wherein the rotating component comprises a bearing isolator having a stationary part and a rotating part with the one or more magnets placed therein or thereon.

19. A method comprising:
 receiving, with a signal processor, signaling from a flux sensor containing information about both a residual field from an electrical supply to a motor of a driven machine and a magnetic field from one or more rotating magnets placed on a rotating component of the driven machine; and
 determining, with the signal processor, corresponding signaling containing information about the operation of the driven machine, based upon a difference between an electrical supply frequency and a slip frequency determined from the signaling received and processed.

20. The method according to claim 19, wherein the method further comprises providing, with the signal processor, the corresponding signaling for further processing to determine further information about the operation of the driven machine.

* * * * *